(12) United States Patent
Schreier et al.

(10) Patent No.: US 9,615,491 B2
(45) Date of Patent: Apr. 4, 2017

(54) INSULATING BODY WITH A CRUCIFORM SHIELD

(75) Inventors: Stephan Schreier, Rahden (DE); Melanie Genau, Luebbecke (DE); Dirk Peter Post, Luebbecke (DE)

(73) Assignee: HARTING ELECTRONICS GMBH, Espelkamp (DE)

( * ) Notice: Subject to any disclaimer, the term of this patent is extended or adjusted under 35 U.S.C. 154(b) by 0 days.

(21) Appl. No.: 14/239,332

(22) PCT Filed: Jun. 26, 2012

(86) PCT No.: PCT/DE2012/100187
§ 371 (c)(1),
(2), (4) Date: Apr. 4, 2014

(87) PCT Pub. No.: WO2013/023645
PCT Pub. Date: Feb. 21, 2013

(65) Prior Publication Data
US 2014/0291009 A1    Oct. 2, 2014

(30) Foreign Application Priority Data

Aug. 18, 2011   (DE) .................. 10 2011 052 792

(51) Int. Cl.
*H05K 9/00*         (2006.01)
*H01R 13/03*        (2006.01)
(Continued)

(52) U.S. Cl.
CPC ............. *H05K 9/00* (2013.01); *H01R 13/035* (2013.01); *H01R 13/652* (2013.01);
(Continued)

(58) Field of Classification Search
CPC ..................... H01R 13/6585; H01R 13/652
(Continued)

(56) References Cited

U.S. PATENT DOCUMENTS 4,411,961 A    10/1983   Tremmel
5,133,679 A    7/1992    Fusselman et al.
(Continued)

FOREIGN PATENT DOCUMENTS

CN    1533602    9/2004
DE    3230805    4/1983
(Continued)

*Primary Examiner* — Hung V Ngo
(74) *Attorney, Agent, or Firm* — Jacobson Holman, PLLC.

(57) ABSTRACT

The invention discloses an insulating body (1) which is provided for receiving and/or electrically contacting at least one conductor of a cable to be connected or for fitting onto a printed circuit board, the insulating body (1) being adapted to be introduced into a dedicated chamber of a plug connector housing and having at least one recess (11) for at least one contact element (13) which can be connected to the individual conductor of the cable to be connected or to a conductor track of the printed circuit board, and including a shielding element (20) by which the contact element is electromagnetically shielded, the insulating body (1) being formed of at least one first component (2) and one second component (10), the first component (2) containing a doping so that the surface of the first component (2) can be provided with a conducting coating (6) by an electroplating process, the shielding element (20) being formed from the conducting coating of the first component (2).

8 Claims, 4 Drawing Sheets

(51) Int. Cl.
*H01R 13/652* (2006.01)
*H01R 13/6585* (2011.01)
*H01R 13/6599* (2011.01)
*H01R 13/6471* (2011.01)
*H01R 13/6587* (2011.01)

(52) U.S. Cl.
CPC ..... *H01R 13/6585* (2013.01); *H01R 13/6599* (2013.01); *H01R 13/6471* (2013.01); *H01R 13/6587* (2013.01)

(58) Field of Classification Search
USPC ........................................................ 174/359
See application file for complete search history.

(56) References Cited

U.S. PATENT DOCUMENTS

| | | | |
|---|---|---|---|
| 5,213,520 A | 5/1993 | Casey et al. | |
| 5,564,948 A | 10/1996 | Harting et al. | |
| 5,718,606 A | 2/1998 | Rigby et al. | |
| 5,823,825 A | 10/1998 | Murphy | |
| 6,077,122 A | 6/2000 | Elkhatib et al. | |
| 6,118,072 A * | 9/2000 | Scott ..................... | H05K 1/189 174/254 |
| 6,284,679 B1 * | 9/2001 | Schilling et al. ............. | 442/230 |
| 6,494,743 B1 * | 12/2002 | Lamatsch et al. ....... | 439/607.05 |
| 7,120,005 B1 | 10/2006 | Luch | |
| 7,140,917 B1 | 11/2006 | O'Halloran et al. | |
| 7,195,518 B2 | 3/2007 | Bert | |
| 7,425,159 B2 | 9/2008 | Lin | |
| 9,363,935 B1 * | 6/2016 | Cook ..................... | H05K 9/0098 |
| 2005/0277340 A1 | 12/2005 | Gordon et al. | |
| 2007/0141908 A1 | 6/2007 | Bert et al. | |
| 2008/0105511 A1 * | 5/2008 | Oh ..................... | H01R 13/6666 192/84.1 |
| 2009/0239418 A1 * | 9/2009 | Dennes .............. | H01R 13/6585 439/607.05 |
| 2012/0034809 A1 | 2/2012 | Reimchen | |
| 2013/0137310 A1 | 5/2013 | Genau | |
| 2013/0180754 A1 * | 7/2013 | Hinoshita ............ | H01B 11/002 174/113 R |
| 2015/0311641 A1 * | 10/2015 | Schreier ............ | H01R 13/6585 439/607.02 |

FOREIGN PATENT DOCUMENTS

| | | |
|---|---|---|
| DE | 4222452 | 1/1993 |
| DE | 9210551 | 12/1993 |
| DE | 43 41 104 | 1/1995 |
| DE | 9415537 | 2/1996 |
| DE | 19742866 | 12/1998 |
| DE | 19852776 | 5/2000 |
| DE | 19907245 | 8/2000 |
| DE | 69834042 | 12/2006 |
| DE | 102009021594 | 10/2010 |
| EP | 0 693 795 | 1/1996 |
| EP | 1256981 | 11/2002 |
| EP | 1 858 117 | 11/2007 |
| EP | 2 194 610 | 6/2010 |
| FR | 2 921 522 | 3/2009 |
| JP | 09-007697 | 1/1997 |
| JP | 2000-311749 | 11/2000 |
| JP | 2008-163371 | 7/2008 |
| JP | 2008-541354 | 11/2008 |
| JP | 2009-146770 | 7/2009 |
| JP | 4480207 | 3/2010 |
| KR | 1019920009530 | 6/1992 |
| WO | WO 2004/025723 | 3/2004 |

\* cited by examiner

INSULATING BODY WITH A CRUCIFORM SHIELD

This is a national stage of PCT/DE12/100187 filed Jun. 26, 2012 and published in German, which has a priority of German no 10 2011 052 792.3 filed Aug. 18, 2011, hereby incorporated by reference, The invention relates to an insulating body which is provided for receiving and/or electrically contacting at least one conductor of a cable to be connected or of a printed circuit board.

Insulating bodies are inserted into dedicated chambers of a plug connector housing. The insulating bodies typically comprise seats for contact elements to which the conductors of a cable to be connected to the plug connector are connected. As an alternative, the contact elements may also be fitted onto a printed circuit board and soldered.

In data transfer technology, insulating bodies having so-called shielding portions are made use of. The shielding portions serve to shield at least two conductors of the cable to be connected—and/or the associated contact elements—electromagnetically from each other.

Such insulating bodies are needed in order to provide multipole plug connectors for analog or digital data transfer, which are adapted to be used in shielded configurations at frequencies of 600 MHz or even higher.

DE 43 41 104C1 shows a multipole printed circuit board plug connector. To shield the plug connector electromagnetically from the environment, it is proposed that the insulating body of the plug connector be provided with a metallization. In order to allow the plug connector to be used at higher data transfer rates, it is further proposed that the contact elements on the insulating body be covered with metalized caps.

Such a plug connector is made up of a large number of individual parts and, accordingly, is complicated to assemble.

The object of the invention consists in proposing a plug connector which is simple to assemble and, at the same time, versatile in its use.

Advantageous configurations of the invention are indicated in the dependent claims.

Contact elements which later constitute the so-called mating face of the plug connector can be mounted into the insulating body according to the invention. The individual conductors of the cable to be connected to the plug connector are connected to the respective contact elements. This may be done via a crimped connection, for example. But any other contacting is also conceivable. If the insulating body according to the invention is installed as a completed plug connector on a printed circuit board, the individual contact elements are, as a rule, fixed thereon by soldering. Other contacting methods such as, for example, press-in pins, are also conceivable.

Connecting the contact elements of the insulating body with the individual conductors of a cable will be mentioned several times below. The insulating body according to the invention is, however, not limited thereto. A contacting of the contact elements on a printed circuit board may also be equivalently provided.

The insulating body is incorporated into a dedicated chamber of a plug connector housing. A cable outlet is typically provided on the plug connector housing. The cable to be connected protrudes into the interior of the plug connector housing through the opening of the cable outlet.

Individual contact elements or contact element pairs are electromagnetically shielded from one another by a shielding element inside the insulating body. As a rule, two contact elements each are shielded as a pair from the other pairs of two.

The insulating body typically has a cavity into which a metallic so-called cruciform shield is inserted. The surface of the cruciform shield is then in contact with the surface of the cavity. This metallic cruciform shield causes the above-described electromagnetic shielding of at least two contact elements from each other.

The insulating bodies known so far are typically surrounded by a metallic contact ring which is in conducting contact with the metallic cruciform shield. The contact ring, for its part, is in conducting (direct) contact with the inner wall of the chamber of the plug connector housing.

The insulating body is typically made from a non-conducting material (plastic). An insulating body is typically produced in an injection molding process. In this process, a plastic material is injected into an injection mold (also referred to as a tool). The injection mold here determines the shape and the surface texture of the insulating body. The insulating body according to the invention is produced in a so-called "two-component injection molding method".

The insulating body consists of at least two different components, a first and a second component.

At least one of these components, normally the first component, is provided with a doping. The doping serves as a catalyst for the metalizing of the surface.

In an advantageous embodiment, the doping involved is palladium seeds which are mixed into the plastic material.

In the completed insulating body, produced in the above injection molding process, at least part of the surface of the first component, which is also referred to as a shielding portion, is provided with a conducting coating by an electroplating process in an electroplating bath. In this process, a metallic substance, preferably copper or a copper alloy, adheres to the doping. Other metal compounds may be applied onto the copper surface in further processing steps. This conducting coating constitutes the shielding element of the insulating body according to the invention.

In an advantageous embodiment, the insulating body includes spring arms which project outward and are formed by the first component (with a doping). These spring arms are provided with a conducting coating in an electroplating bath. The conductively coated spring arms are in conducting contact with the shielding element. When the insulating body is introduced into the chamber of the plug connector housing, these spring arms are also in conducting contact with the housing of the plug connector and fulfill the same function as the above-mentioned metallic contact ring in the insulating bodies known so far.

An insulating body according to the invention is configured as a one-piece part, inclusive of the shielding element (conducting coating). The contact elements can be directly assembled. An additional assembly step for the shielding element or the metallic contact ring is dispensed with.

In an advantageous embodiment of the invention, the cavity penetrates the insulating body in a cross shape in the axial direction. In this way, a cruciform metal coating in the insulating body is also obtained, This is advantageous in particular for an eight-pole plug connector. Respective pairs of two contact elements can be shielded from each other.

In the case of twelve-pole plug connectors, it is advantageous to design the axial penetration of the cavity by the insulating body in a star shape. In a symmetrical division of the individual arms of the star, again respective pairs of two contact elements are shielded from each other.

It may also be advantageous to provide a plurality of cavities in the insulating body which are oriented parallel to each other. This produces shielding elements which are oriented parallel to each other. This is advantageous in particular for cuboid-shaped insulating bodies.

Depending on the number of contact elements and the technically required shielding, the shape of the shielding element according to the invention may be made to be variable. Any shape and penetration in the insulating body is technically realizable.

The method of manufacturing the insulating body according to the invention will now be described below:

As already mentioned above, the insulating body is manufactured in a two-component injection molding process from at least first and second components. At least one of these components is provided with a doping. Advantageously, the doping involved is palladium seeds.

In a first processing step, the first component is injected into the injection mold. The first component is typically provided with the above-mentioned palladium doping. In this case, the first component forms the surface region which later is to constitute the shielding element.

In a second processing step, the second component is injected into the injection mold and partly encloses the first component, so that the final shape of the insulating body is formed. The surface region for the shielding element is molded in the first component already in the first processing step and is not covered by the second component in the second processing step.

After removal from the mold, the insulating body is now immersed in an electroplating bath. Copper is deposited on the surface that is still free, of the doped component by a chemical process not described in greater detail. Various further metal layers may now be applied on this copper layer in further steps. The finished coating constitutes the shielding element.

According to the invention, it is also possible to provide insulating bodies having only one seat for an individual contact element. Ideally, the shielding portion would then surround the seat for the contact element. In this way, a double-shielded, single-pole plug connector can be produced by a metallic housing.

EXEMPLARY EMBODIMENT

An exemplary embodiment of the invention is illustrated in the drawings and will be explained in greater detail below. In the drawings:

FIG. 1 shows a perspective illustration of a first embodiment of an insulating body 1 according to the invention.

Figure 1:
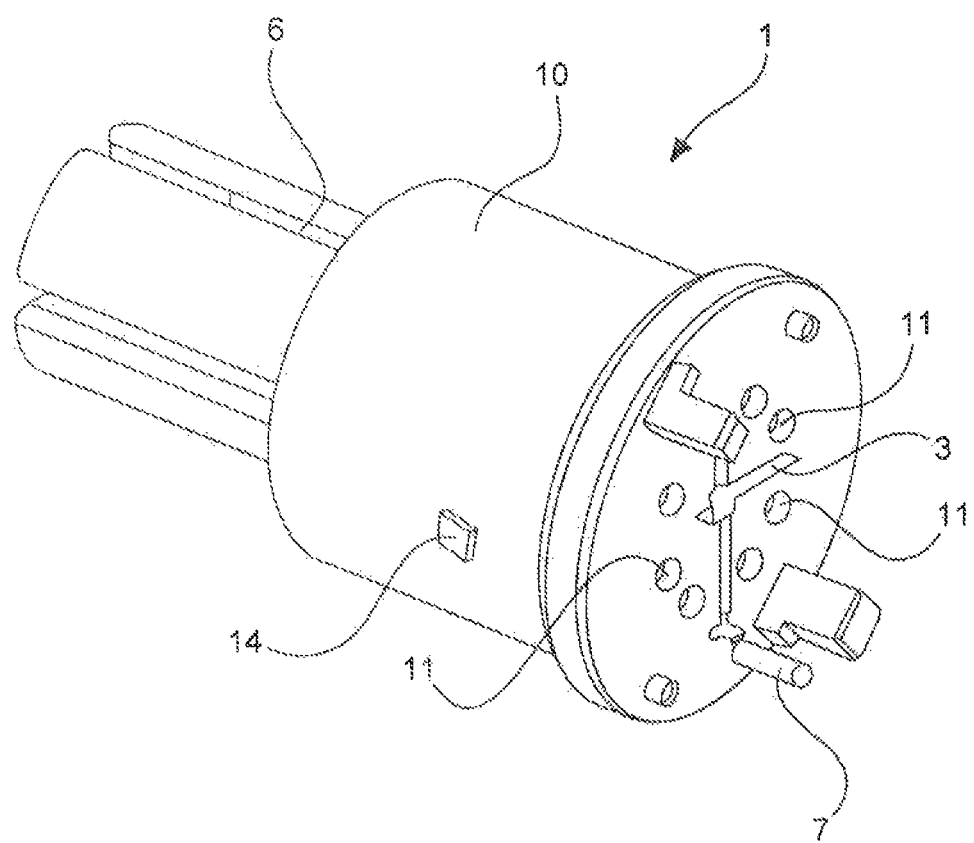
FIG. 1 shows a perspective illustration of an insulating body.
Figure 2:
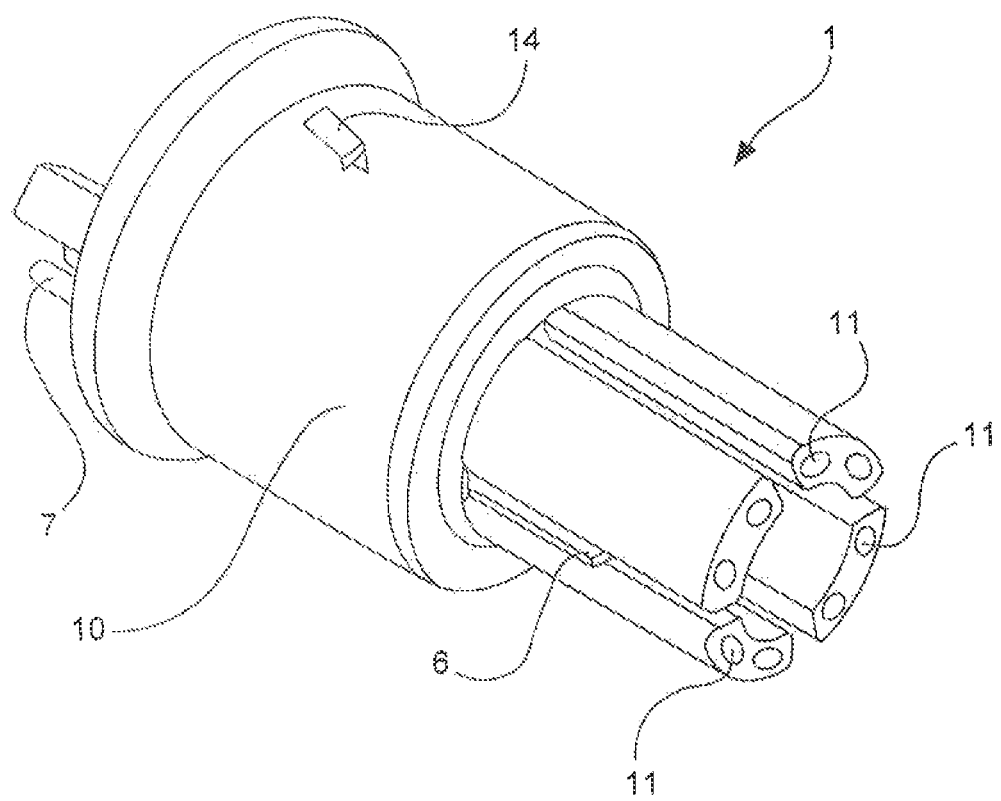
FIG. 2 shows a further perspective illustration of an insulating body.
Figure 3:
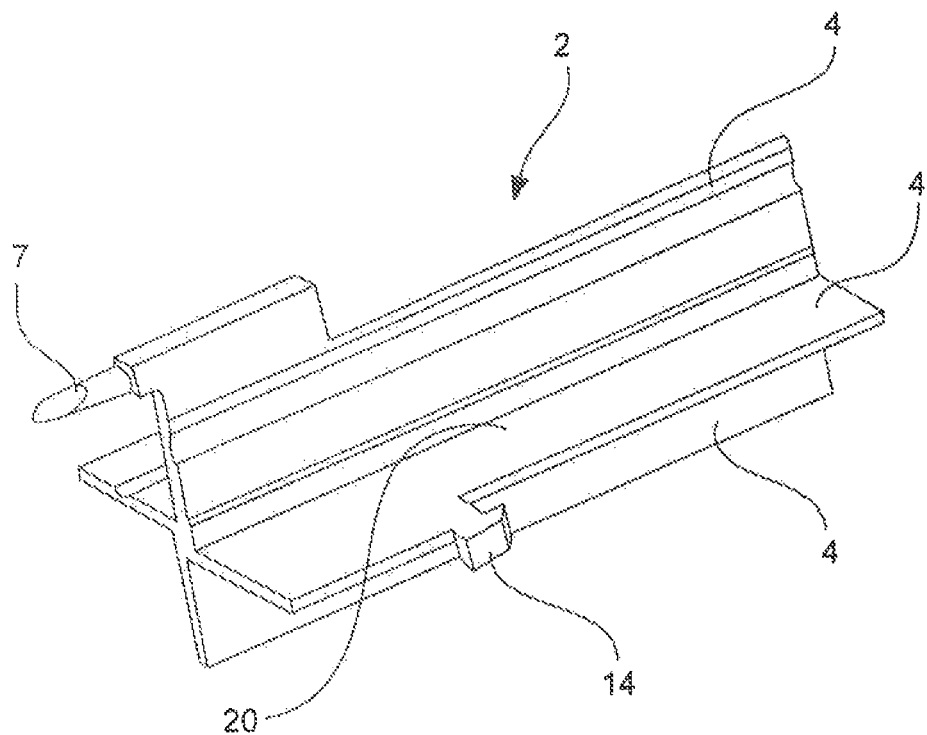
FIG. 3 shows a perspective illustration of a doped component of the insulating body.

The insulating body 1 is made up of a first component 2 and a second component 10. The first component is provided with a palladium doping and is provided with a conducting coating 6 in an electroplating bath, the conducting coating forming the shielding element 20.

The insulating body 1 has a substantially cylindrical shape. Provided on the front end are recesses 11 which are suitable for the mounting of contact elements (not shown here). The insulating body 1 is traversed by a cruciform cavity 3. Further provided is a so-called shield contact 7 which provides the contact for transfer of the shielding and, for example, is intended for grounding the plug connector. For this purpose, the shield contact 7 is connected either to the ground conductor of the cable to be connected or to the ground wire of the printed circuit board.

In a particularly preferred embodiment of the invention, the shield contact 7 is made up of part of the first material component 2 and the conducting coating 6 located thereon. As an alternative, the shield contact 7 may also be formed of a separate metallic contact element.

Spring arms 14 project from the lateral surface of the insulating body 1 which, upon insertion into a chamber of a plug connector housing, are in direct contact with this chamber. In the case of a metallic housing, the spring legs 14 are in conducting contact with the housing. The first component 2 forms the elements which are in conducting contact with each other. Altogether, the shielding element 20, the spring legs 14 and the shield contact are in conducting contact.

The first component 2 of the insulating body 1 substantially has the shape of a cross extruded into the cavity. Two wings 4 of the first component 2 form the above-mentioned spring legs 14. The shield contact 7 is molded integrally with a wing 4 that is arranged perpendicularly thereto.

A second component 10 is injection-molded around the first component 2. The surface of the first component 2 which is not covered by the material of the second component 10 can subsequently be provided with a conducting coating 6 in an electroplating bath.

Figure 4:
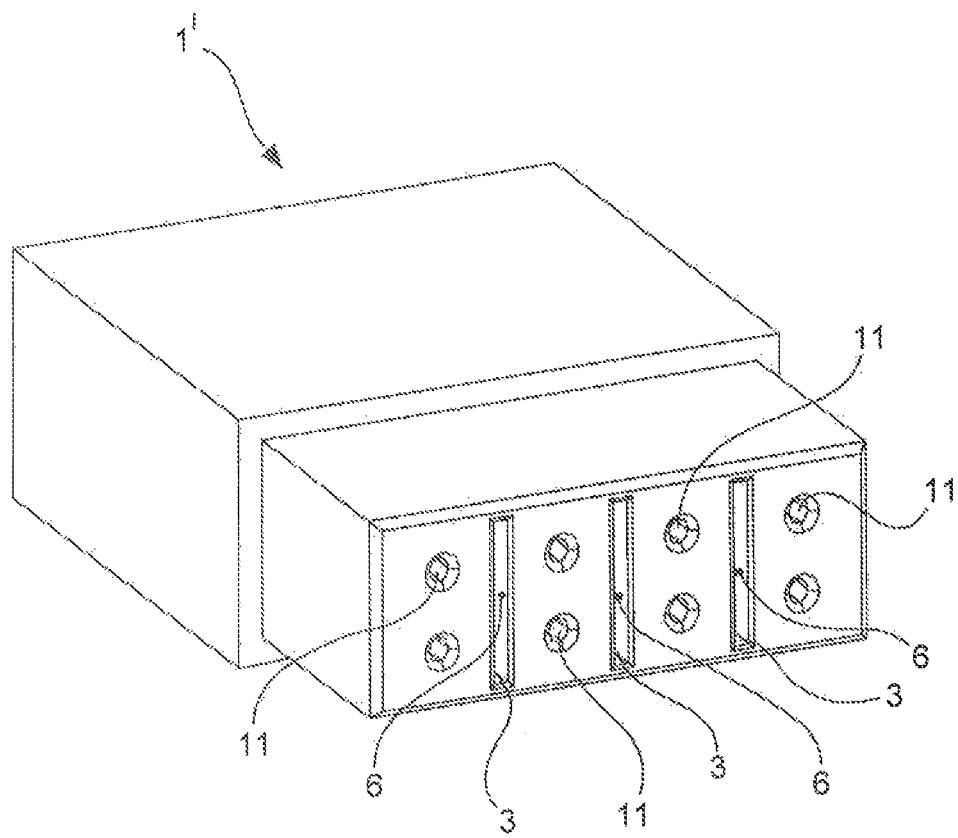
FIG. 4 shows a perspective illustration of a further embodiment of an insulating body.

FIG. 4 shows a further embodiment of an insulating body 1' according to the invention. The insulating body 1' has a substantially cuboid shape. Like elements are provided with the same reference numbers.

The insulating body 1' is traversed by three cavities 3 which are parallel to one another, The surfaces of the cavities 3 are formed by the material of the first, doped plastic component. The surface of the cavity 3 is provided with a conducting coating 6 in an electroplating bath.

The three shielding surfaces 6 that are parallel to one another are conductively connected and are likewise in conducting contact with a shield contact element (not shown here). In this embodiment, too, spring elements (not shown here) may be provided, which are in conducting contact with the plug connector housing.

All of the features of the various embodiments disclosed in this document may be combined with each other as desired, without departing from the underlying concept of the invention.

LIST OF REFERENCE NUMBERS

Insulating Body with a Cruciform Shield
1 insulating body
2 first component
3 cavity
4 wing
6 conducting coating
7 shed contact dement
10 second component
12 pair of two
14 spring arm
20 shielding element

The invention claimed is:

1. A one-piece insulating body for electrical connection with a connector of a cable or a printed circuit board, said one-piece insulating body insertable into a plug connector housing and including at least one recess for receiving a contact element that is connectable with said connector of a cable or printed circuit board, said one-piece insulating body comprising,
- a first component formed from a plastic material containing a doping that serves as a catalyst for a conductive coating, a conductive coating electroplated to adhere upon said plastic material containing a doping, the conductive coating forming an electromagnetic shielding element,
- a second component injection molded to and around, and united to form one piece with, and enclosing only a first part of, said first component, leaving an unenclosed second part of said first component, wherein said unenclosed second part of said first component includes said conductive coating that forms said electromagnetic shielding element,
- wherein said shielding element penetrates the insulating body in a cross shape in an axial direction and,
- wherein said first component, second component, and conductive coating form said one-piece insulating body.

2. A one-piece insulating body for electrical connection with a connector of a cable or a printed circuit board, said one-piece insulating body insertable into a plug connector housing and including at least one recess for receiving a contact element that is connectable with said connector of a cable or printed circuit board, said one-piece insulating body comprising,
- a first component formed from a plastic material containing a doping that serves as a catalyst for a conductive coating, a conductive coating electroplated to adhere upon said plastic material containing a doping, the conductive coating forming an electromagnetic shielding element,
- a second component injection molded to and around, and united to form one piece with, and enclosing only a first part of, said first component, leaving an unenclosed second part of said first component, said second component defining a cavity within which said first part of said first component resides, and wherein said unenclosed second part of said first component includes said conductive coating that forms said electromagnetic shielding element,
- a shield contact element extending from said electromagnetic shielding element of said first component through said second component to the exterior of said second component,
- wherein said first component, second component, and conductive coating form said one-piece insulating body.

3. The insulating body according to claim 2, wherein said first component doping comprises palladium seeds.

4. The insulating body according to claim 2, wherein said conductive coating comprises copper or a copper alloy.

5. The insulating body according to claim 2, wherein said second component is formed from a plastic material.

6. The insulating body according to claim 2, wherein said shield contact element is molded integrally with said first component electromagnetic shielding element.

7. The insulating body of claim 6 wherein said shield contact element is formed from the plastic material of the first component that contains a doping that serves as a catalyst for a conductive coating, and includes the conductive coating of the first component electroplated to adhere upon the plastic material of the shield contact element.

8. The one-piece insulating body of claim 2 formed from said first component molded around and united with said second component has a substantially cylindrical shape.

* * * * *